(12) United States Patent
Cheng et al.

(10) Patent No.: US 8,917,340 B2
(45) Date of Patent: Dec. 23, 2014

(54) CIRCUIT BOARD ASSEMBLY AND CAMERA MODULE USING SAME

(71) Applicants: Hong Fu Jin Precision Industry (ShenZhen) Co., Ltd., Shenzhen (CN); Hon Hai Precision Industry Co., Ltd., New Taipei (TW)

(72) Inventors: Yu-Tsan Cheng, New Taipei (TW); Wen-Chang Chen, New Taipei (TW); Shin-Wen Chen, New Taipei (TW); Wen-Hsiung Chen, New Taipei (TW); Shu-Sheng Peng, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

(*) Notice: Subject to any disclaimer, the term of this patent is extended or adjusted under 35 U.S.C. 154(b) by 58 days.

(21) Appl. No.: 13/727,467

(22) Filed: Dec. 26, 2012

(65) Prior Publication Data
US 2014/0049684 A1  Feb. 20, 2014

(30) Foreign Application Priority Data
Aug. 15, 2012 (CN) .......................... 2012 1 0289930

(51) Int. Cl.
| | | |
|---|---|---|
| *H04N 5/335* | (2011.01) | |
| *H04N 5/225* | (2006.01) | |
| *H01L 23/12* | (2006.01) | |
| *H05K 1/02* | (2006.01) | |
| *H05K 1/14* | (2006.01) | |
| *H05K 3/32* | (2006.01) | |

(52) U.S. Cl.
CPC ............. *H05K 1/0281* (2013.01); *H04N 5/225* (2013.01); *H04N 5/2253* (2013.01); *H05K 1/141* (2013.01); *H05K 3/323* (2013.01); *H05K 2201/09781* (2013.01); *H05K 2201/10121* (2013.01)
USPC .......................... 348/294; 348/373; 257/700

(58) Field of Classification Search
CPC . H04N 5/2253; H04N 5/2257; H05K 1/0218; H05K 2201/10121; H05K 2201/10371; H05K 2201/10734
USPC ................... 348/294, 335, 340, 373; 257/700
See application file for complete search history.

(56) References Cited

U.S. PATENT DOCUMENTS

| | | | |
|---|---|---|---|
| 6,940,176 B2* | 9/2005 | Chen .............................. | 257/778 |
| 8,139,145 B2* | 3/2012 | Ryu et al. ....................... | 348/373 |
| 2011/0215438 A1* | 9/2011 | Kwang et al. ................. | 257/531 |
| 2012/0140101 A1* | 6/2012 | Afshari et al. ................ | 348/308 |

* cited by examiner

*Primary Examiner* — Trung Diep
(74) *Attorney, Agent, or Firm* — Novak Druce Connolly Bove + Quigg LLP

(57) ABSTRACT

A circuit board assembly includes a flexible circuit board, a conductive adhesive, and a number of reinforcing plates. The flexible circuit board includes a first surface and a second surface. A number of board pads are mounted on the first surface. The conductive adhesive is coated on the first surface and entirely covers all of the board pads. The reinforcing plates are positioned on the second surface. Each of the reinforcing plates spatially corresponds to a respective one of the board pads. The reinforcing plates provide both physical grounding and stiffening of the circuit board assembly.

16 Claims, 4 Drawing Sheets

CIRCUIT BOARD ASSEMBLY AND CAMERA MODULE USING SAME

BACKGROUND

1. Technical Field

The present disclosure relates to a circuit board assembly and a camera module using the same.

2. Description of Related Art

A typical camera module includes a flexible printed circuit board and an image capturing device. The flexible printed circuit board includes a supporting surface. The image capturing device is supported on the supporting surface and electrically connected to the flexible printed circuit board. However, because the flexible printed circuit board is easily deformed, this leads to the image capturing device Therefore, it is desirable to provide a circuit board assembly and a camera module which can overcome the above-mentioned limitations.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure.

DETAILED DESCRIPTION

Figure 1:
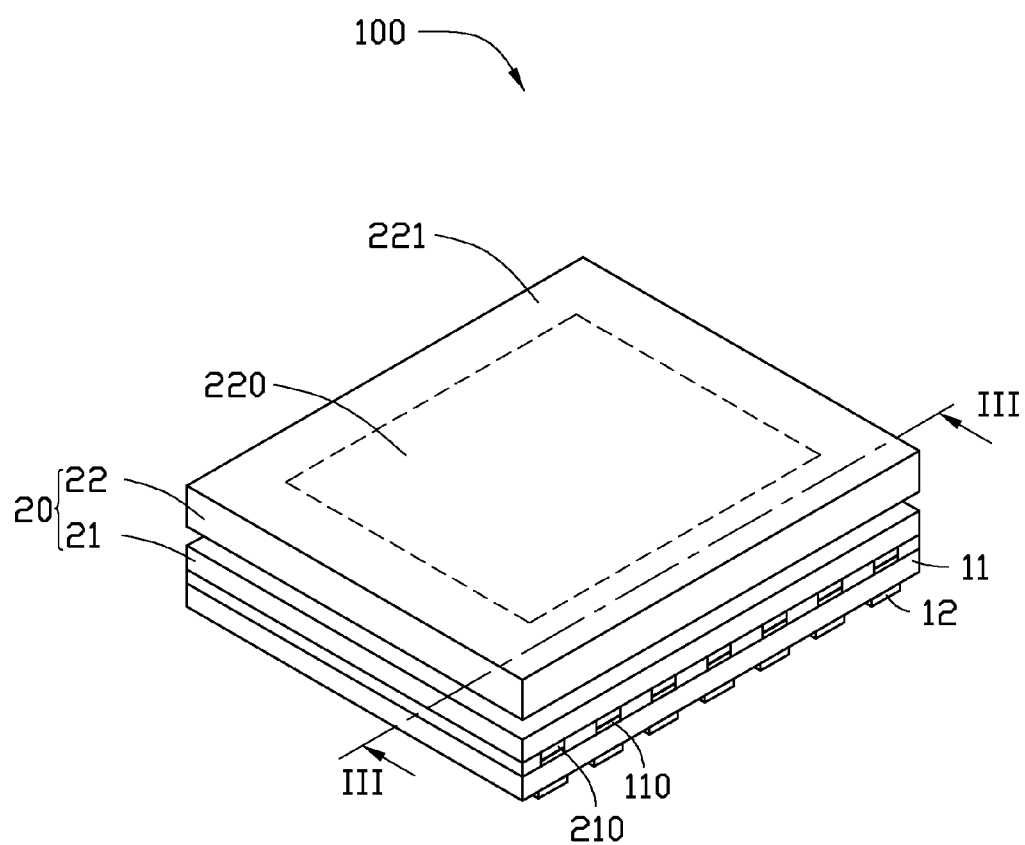
FIG. 1 is an assembled, isometric view of a camera module, according to a first exemplary embodiment.
Figure 2:
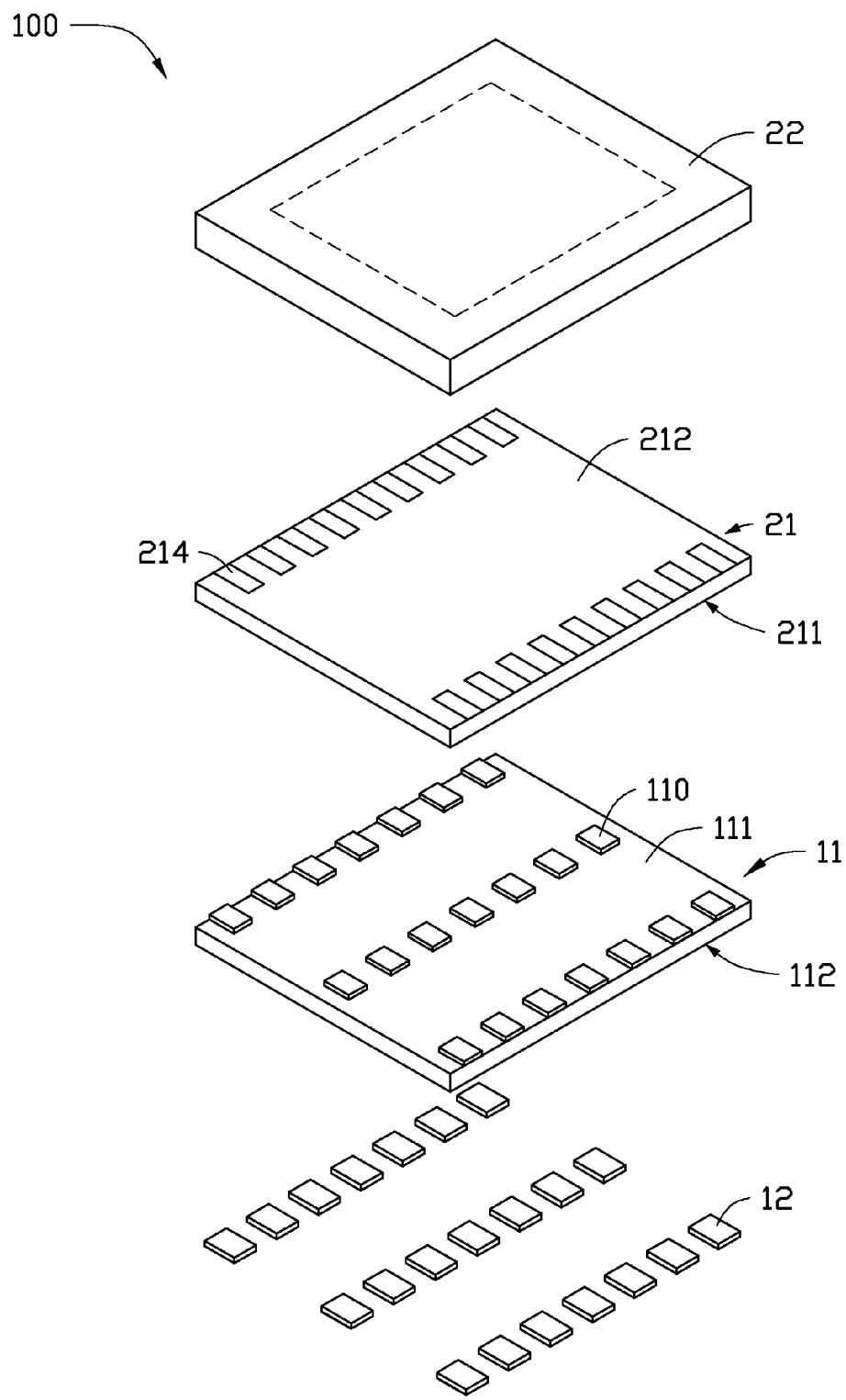
FIG. 2 is an exploded, isometric view of the camera module of FIG. 1.
Figure 3:
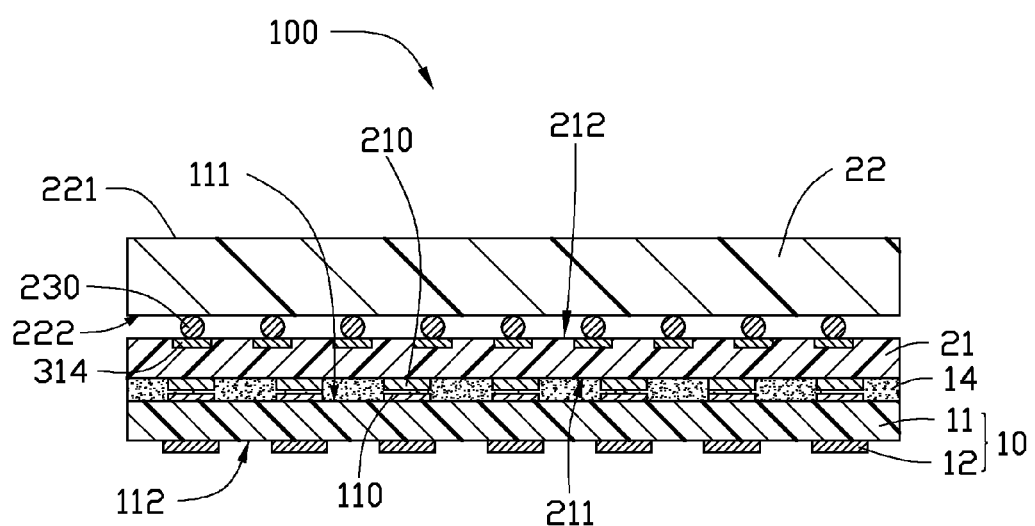
FIG. 3 is a cross-sectional view taken along line III-III of FIG. 1.

FIGS. 1-3 show a camera module 100, according to a first exemplary embodiment. The camera module 100 includes a circuit board assembly 10, a conductive adhesive 14 and an image capturing device 20.

The circuit board assembly 10 includes a flexible printed circuit board 11 and a number of reinforcing plates 12 (See FIG. 3). The flexible printed circuit board 11 includes a first surface 111 and a second surface 112 facing away from the first surface 111. A number of board pads 110 are mounted on the first surface 111. In the embodiment, all of the board pads 110 have an essentially identical size. In the embodiment, each of the board pads 110 is substantially rectangular in shape.

The reinforcing plates 12 are positioned on the second surface 112. Each of the reinforcing plates 12 spatially corresponds to a respective one of the board pads 110. The shape of the reinforcing plates 12 correspond to the shape of the board pads 110. In the embodiment, each of the reinforcing plates 12 is also substantially rectangular in shape. The reinforcing plates 12 provide both physical grounding and stiffening of the circuit board assembly 10. In the embodiment, all of the reinforcing plates 12 have essentially an identical size, and the size of the reinforcing plates 12 is bigger than the size of the board pads 110. All of the reinforcing plates 12 are made from metal, such as copper or iron.

In the embodiment, the conductive adhesive 14 is an Anisotropic Conductive Film (ACF), which coats the first surface 111 of the flexible printed circuit board 11 and entirely covers all of the board pads 110.

The image capturing device 20 includes a substrate 21 and an image sensor 22.

The substrate 21 is made of a material such as: polyimide, ceramic, or glass. The substrate 21 is positioned on the first surface 111 of the flexible printed circuit board 11 through the conductive adhesive 14. The substrate 21 includes a third surface 211 and a fourth surface 212 facing away from the third surface 211. The third surface 211 faces the first surface 111. A number of substrate pads 210 are mounted on the third surface 211. Each of the substrate pads 210 aligns with a respective one of the board pads 110. Each of the substrate pads 210 is electrically connected to a respective board pad 110 through the conductive adhesive 14. A number of bonding pads 314 are positioned on the fourth surface 212.

The image sensor 22 can be a charged coupled device (CCD) or a complementary metal-oxide-semiconductor (CMOS). The image sensor 22 includes an imaging surface 221 and a connecting surface 222 facing away from the imaging surface 221. The imaging surface 221 has a photosensitive area 220 formed on the center of the imaging surface 221. The image sensor 22 has a number of chip balls 230 formed on the connecting surface 222. Each of the chip balls 230 aligns with a respective one of the bonding pads 314. Each of the chip balls 230 is connected to a respective one of the bonding pads 314 by soldering or similar method, and as such, the image sensor 22 is electrically connected to the substrate 21.

Alternatively, the image sensor 22 may be mechanically and electrically connected to the substrate 21 by a package process such as chip-scale, wafer-level chip-scale, ceramic leaded, plastic leadless chip, thermal compression bonding, or a flip chip packaging process.

Figure 4:
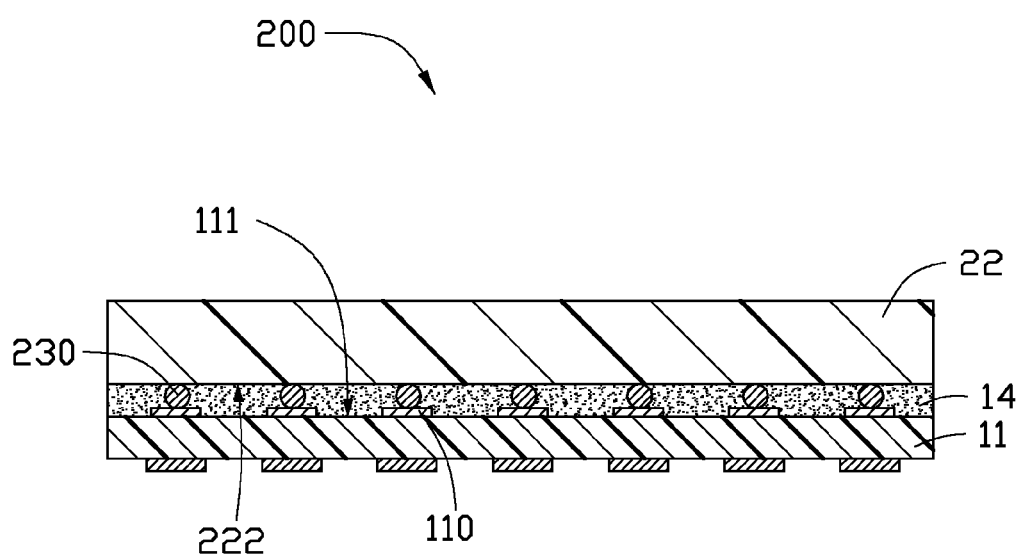
FIG. 4 is a cross-sectional view of a camera module, according to a second exemplary embodiment.

FIG. 4 shows a camera module 200 in accordance with a second exemplary embodiment. The camera module 200 is essentially similar to the camera module 100 in the first embodiment, except that the substrate 21 is omitted, each of the chip balls 230 on the connecting surface 222 are directly soldered to a respective one of the board pads 110, and the conductive adhesive 14 is positioned between the connecting surface 222 and the first surface 111 and covers the chip balls 230 and the board pads 110, and as such the image sensor 22 is electrically connected to the flexible printed circuit board 11 through the conductive adhesive 14.

It will be understood that the above particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A circuit board assembly, comprising:
  a flexible circuit board comprising a first surface and a second surface facing away from the first surface, the flexible circuit board comprising a plurality of board pads mounted on the first surface;
  a conductive adhesive coated on the first surface and entirely covering all of the board pads; and
  a plurality of reinforcing plates positioned on the second surface, each of the reinforcing plates being substantially rectangular in shape and spatially aligned with a respective one of the board pads, the reinforcing plates configured for providing physical grounding and stiffening of the circuit board assembly.

2. The circuit board assembly of claim 1, wherein all of the board pads have an essentially identical size.

3. The circuit board assembly of claim 2, wherein all of the reinforcing plates have an essentially identical size, and the size of the reinforcing plates is bigger than the size of the board pads.

4. The circuit board assembly of claim 1, wherein each of the reinforcing plates is made of metal.

5. The circuit board assembly of claim 4, wherein the metal is selected from one of copper and iron.

6. The circuit board assembly of claim 1, wherein the conductive adhesive is an anisotropic conductive film.

7. A camera module comprising:
  a circuit board assembly comprising:
    a flexible circuit board comprising a first surface and a second surface facing away from the first surface, the flexible circuit board comprising a plurality of board pads mounted on the first surface;
    a conductive adhesive coated on the first surface and entirely covering all of the board pads;
    a plurality of reinforcing plates positioned on the second surface, each of the reinforcing plates being substantially rectangular in shape and spatially aligned with a respective one of the board pads, the reinforcing plates configured for providing physical grounding and stiffening of the circuit board assembly; and
  an image capturing device positioned on the first surface through the conductive adhesive.

8. The camera module of claim 7, wherein the image capturing device comprises a substrate, the substrate is positioned on the first surface of the flexible printed circuit board through the conductive adhesive, the substrate comprises a third surface facing with the first surface and a plurality of substrate pads mounted on the third surface, each of the substrate pads is aligned with and electrically connected to a respective one of the board pads through the conductive adhesive.

9. The camera module of claim 8, wherein the substrate also comprises a fourth surface facing away from the third surface and a plurality of bonding pads positioned on the fourth surface, the image capturing device also comprises an image sensor, the image sensor comprises an imaging surface and a connecting surface facing away from the imaging surface, the image sensor has a plurality of chip balls on the connecting surface, each of the chip balls is soldered to a respective one of the bonding pads.

10. The camera module of claim 9, wherein the imaging surface has a photosensitive area on a center of the imaging surface.

11. The camera module of claim 7, wherein the image capturing device comprises an image sensor, the image sensor comprises an imaging surface and a connecting surface facing away from the imaging surface, the image sensor has a plurality of chip balls on the connecting surface, each of the chip balls is soldered to a respective one of the board pads.

12. The camera module of claim 7, wherein all of the board pads have an essentially identical size.

13. The camera module of claim 12, wherein all of the reinforcing plates have an essentially identical size, and the size of the reinforcing plates is bigger than the size of the board pads.

14. The camera module of claim 7, wherein each of the reinforcing plates is made of metal.

15. The camera module of claim 14, wherein the metal is selected from one of copper and iron.

16. The camera module of claim 7, wherein the conductive adhesive is an anisotropic conductive film.

* * * * *